United States Patent [19]
Harman

[11] Patent Number: 4,460,875
[45] Date of Patent: Jul. 17, 1984

[54] NEGATIVE FEEDBACK AMPLIFIERS INCLUDING DIRECTIONAL COUPLERS

[75] Inventor: Stephen G. Harman, Nepean, Canada

[73] Assignee: Northern Telecom Limited, Montreal, Canada

[21] Appl. No.: 390,521

[22] Filed: Jun. 21, 1982

[51] Int. Cl.³ .............................................. H03F 3/60
[52] U.S. Cl. .................................... 330/286; 330/53; 330/293
[58] Field of Search .......................... 330/53, 286, 293

[56] References Cited

U.S. PATENT DOCUMENTS

| | | | |
|---|---|---|---|
| 3,066,264 | 11/1962 | Goetter | 330/107 |
| 3,371,284 | 2/1968 | Engelbrecht | 330/286 |
| 3,426,298 | 2/1969 | Sontheimer et al. | 333/10 |
| 3,514,711 | 5/1970 | Fjällbrant | 330/53 |
| 3,624,536 | 11/1971 | Norton | 330/53 |
| 3,638,134 | 1/1972 | Beurrier et al. | 330/149 |
| 3,891,934 | 6/1975 | Norton et al. | 330/21 |
| 4,042,887 | 8/1977 | Mead et al. | 330/53 |

FOREIGN PATENT DOCUMENTS 1762764 11/1971 Fed. Rep. of Germany .

Primary Examiner—James B. Mullins
Assistant Examiner—Gene Wan
Attorney, Agent, or Firm—R. John Haley

[57] ABSTRACT

An intermediate frequency preamplifier of a microwave radio receiver includes an amplifier circuit having a negative feedback path including a directional coupler constituted by two transformers. One port of the directional coupler is terminated with a complex impedance, producing a controlled mis-match, which is adjustable to optimize the input return loss of the amplifier without changing the noise figure of the preamplifier. The amplifier circuit has a low impedance output constituted by a common-collector transistor so that the signal reflected back into the directional coupler by the mismatch does not significantly affect the output of the amplifier.

18 Claims, 1 Drawing Figure

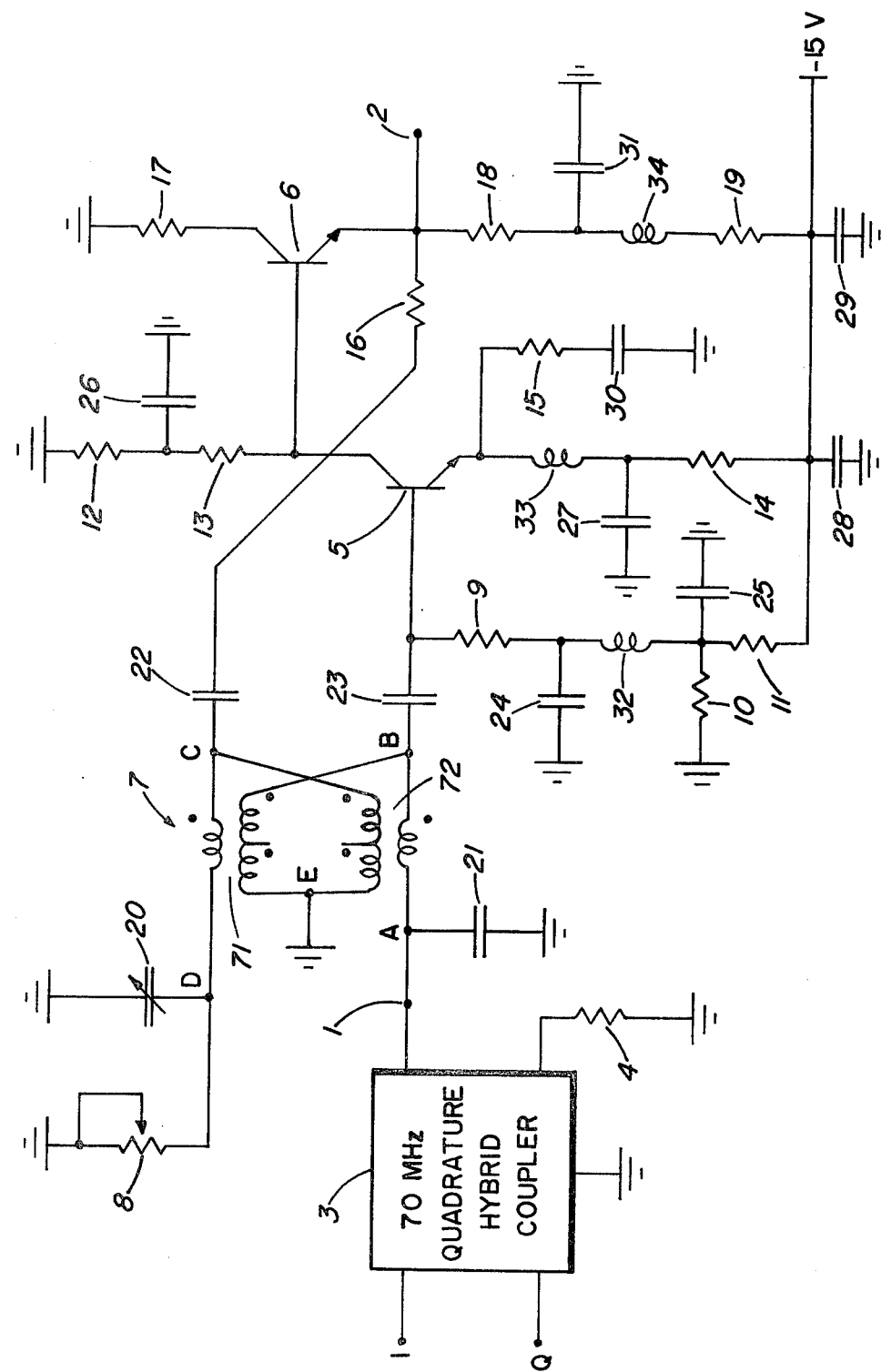

NEGATIVE FEEDBACK AMPLIFIERS INCLUDING DIRECTIONAL COUPLERS

This invention relates to negative feedback amplifiers including directional couplers.

It is known, for example from Norton U.S. Pat. No. 3,624,536 issued Nov. 30, 1971, to provide an amplifier having a negative feedback path including a directional coupler for amplifying high frequency signals. Such an amplifier is typically required to meet conflicting requirements of a low noise figure and linear operation over a wide dynamic range, so that it can handle both low and high level signals.

Such an amplifier may be used as an intermediate frequency (I.F.) preamplifier in a microwave radio receiver, the I.F. being for example about 70 MHz. In such a radio receiver it is desirable to reduce radio frequency filtering requirements, and to provide an enhanced signal-to-noise ratio, by using an image-reject down converter which includes a quadrature hybrid coupler to an output of which the I.F. preamplifier is coupled. However, this arrangement requires that the I.F. preamplifier input be matched to the characteristic impedance of the quadrature hybrid coupler, i.e. that the I.F. preamplifier have a high input return loss, in addition to meeting the above requirements of a low noise figure and linear operation over a wide dynamic range. In the design of known amplifiers a compromise must be made among all of these conflicting requirements.

An object of this invention, therefore, is to provide an amplifier in which the conflict among the requirements is reduced.

According to one aspect, the invention provides an amplifier comprising an amplifier circuit and a negative feedback path for said amplifier circuit, the negative feedback path including a directional coupler having a first port coupled to an input of the amplifier, a second port coupled to an input of the amplifier circuit, a third port coupled to an output of the amplifier circuit, and a fourth port, and complex impedance means coupled to said fourth port for controlling the input return loss of the amplifier.

Thus in accordance with this invention the input return loss of the amplifier is controlled by complex impedance means which terminates the directional coupler with a determined mis-match, the resulting reflected signal influencing the amplifier's input return loss which can accordingly be readily optimized, without significantly affecting the noise figure or the dynamic range of the amplifier.

The impedance of the complex impedance means is preferably adjustable, to permit convenient optimization of the input return loss. The complex impedance means can conveniently comprise a resistor connected in parallel with a capacitor, each of which may be variable, or it can comprise a higher order network.

The directional coupler preferably comprises transformer coupling means, in which case the amplifier preferably includes capacitive means for compensating for leakage inductance of the transformer coupling means.

The amplifier circuit preferably comprises a common-collector transistor amplifier stage whose output constitutes the output of the amplifier circuit. The low output impedance of such a stage, which can be matched to the characteristic impedance of the directional coupler by a series-connected impedance matching resistor, is advantageous in that the output is thereby relatively unaffected by the signal which is reflected back through the directional coupler by the complex impedance means.

The amplifier circuit also preferably comprises a common-emitter transistor amplifier stage whose input constitutes the input of the amplifier circuit, the common-emitter transistor amplifier stage including an inductor connected in series with the emitter of the common-emitter transistor. Such an inductor provides inductive degeneration of the amplifier gain with increasing frequency, thereby providing the amplifier with a flat intermodulation characteristic, as is desired.

According to another aspect, the invention provides an amplifier comprising an amplifier circuit and a negative feedback path for said amplifier circuit, the negative feedback path including a directional coupler having first, second, third and fourth ports of which the first and second ports are coupled together and the third and fourth ports are coupled together with little loss, the first and fourth ports are coupled together and the second and third ports are coupled together with a predetermined coupling factor, and the first and third ports and the second and fourth ports are substantially isolated from one another, wherein the first port is coupled to an input of the amplifier, the second port is coupled to an input of the amplifier circuit, and the third port is coupled to an output of the amplifier circuit, and complex impedance means coupled to the fourth port of the directional coupler for controlling the input return loss of the amplifier.

The invention will be further understood from the following description with reference to the accompanying drawing, which schematically illustrates an amplifier in accordance with an embodiment of the invention.

The drawing shows an intermediate frequency (I.F.) preamplifier, having an input terminal 1 and an output terminal 2, of a microwave radio receiver. The I.F. is 70 MHz with a pass band of about 50 to 90 MHz. In order to reduce the requirements for radio frequency filters which are bulky and expensive, the preamplifier is supplied with an input signal from an image-reject down converter which includes a quadrature hybrid coupler 3. The coupler 3, which is assumed to have a characteristic impedance of 50Ω, is supplied with phase quadrature signals I and Q, has one output terminated with a matching 47Ω resistor 4, and has its other output connected to the preamplifier input terminal 1.

The preamplifier is required to have a low noise figure to achieve a good signal-to-noise ratio, and good linearity over a wide dynamic range so that it can handle both low and high level input signals. In addition, the connection to the coupler 3 necessitates good matching of the input impedance of the preamplifier to the characteristic impedance of the coupler, so that the preamplifier has a high input return loss. In order to fulfill these requirements, the preamplifier consists of an inverting amplifier connected as illustrated in the drawing and comprising two transistors 5 and 6 having a negative feedback path including a directional coupler 7, with resistors 8 to 19, capacitors 20 to 31, and inductors 32 to 34 having the following magnitudes:

8—100Ω variable
20—2-8pF variable
9—100Ω
21—10pF
10—3.3kΩ

22,23—10nF
11—1.6kΩ
24—2.2pF
12—200Ω
25—22nF
13—220Ω
26-29—10nF
14—330Ω
30—10pF
15,16—47Ω
31—3.3pF
17—22Ω
32—6.8 μH
18—68Ω
33—20nH
19—300Ω
34—6.8 μH

The transistors 5 and 6 are type NE02136 and BFR91 respectively, and operate with collector currents of 12 mA and 24 mA respectively. The collector current of the transistor 5 is selected to provide the best compromise between the requirements for a low noise figure (for which a low collector current is desirable) and a wide dynamic range (for which a high collector current is desirable). In making this selection the requirement for good matching is ignored so that, but for the features of the present invention described below, the preamplifier would have a poor input return loss of only 6 to 8 dB. An input return loss of 20 dB or better is desired and is provided as described below.

The directional coupler 7 has four ports which are referenced A, B, C, and D in the drawing, a point E being connected to a point of reference potential, circuit ground. The coupler 7 is substantially loss-less, so that between the ports A and B, and likewise between the ports C and D, there is very little signal loss, for example only 0.2 dB. Between the ports B and C there is a predetermined coupling factor and hence a predetermined loss of 13.3 dB and zero phase shift; between the ports A and D there is the same loss of 13.3 dB and a phase shift of 180°. The ports A and C are substantially isolated from one another, as are the ports B and D.

The directional coupler is constituted by two separate transformers 71 and 72 interconnected as shown. Dots adjacent to the transformer windings show the sense of the windings. The two transformers are identical to one another, each transformer consisting of a low impedance winding and a high impedance winding wound on an Indiana General type BBR7404 core, which has an overall diameter of about 2.5 mm. The windings of each transformer are interpositioned on the respective core to provide tight coupling, the low impedance winding consisting of 3 turns of 32 A.W.G. wire, and the high impedance winding consisting of two series-connected bifilar-wound coils each of 7 turns of 38 A.W.G. wire. Each transformer thus has a turns ratio of 14:3. The low and high impedance windings of the transformer 71 are connected respectively between the ports C and D and between the port B and the point E; those of the transformer 72 are connected respectively between the ports A and B and between the port C and the point E.

The port A and the capacitor 21, which serves to compensate for the leakage inductance of the directional coupler and thereby facilitate broadband operation, are connected to the input terminal 1. The port B is coupled via the d.c. blocking capacitor 23 to the base of the transistor 5, which operates in a common emitter mode. Base bias for the transistor 5 is provided by the resistors 10 and 11, decoupled by the capacitor 25, via the inductor 32 which acts as a radio frequency choke. The resistor 9 and capacitor 24 serve to damp the input to the transistor 5 at frequencies in the cut-off region above about 250 MHz. Emitter bias for the transistor 5 is provided by the resistor 14, decoupled by the capacitors 27 and 28, via the inductor 33, which provides inductive degeneration for the transistor 5 to control its gain-bandwidth. The resistor 15 and capacitor 30, connected in a series circuit to the emitter of the transistor 5, define the impedance at this emitter at frequencies above about 250 MHz to facilitate stable operation.

The collector of the transistor 5 is connected to the series-connected resistors 13 and 12, decoupled by the capacitor 26, and is connected directly to the base of the common collector transistor 6. Emitter bias for this transistor is provided by the resistor 19, decoupled by the capacitor 29, via the inductor (radio frequency choke) 34 and the resistor 18, which with the capacitor 31 facilitates stable operation of the transistor 6 at frequencies above about 250 MHz. The emitter of the transistor 6 is connected directly to the output terminal 2, and is also coupled to the input of the amplifier via a negative feedback path which includes the directional coupler 7. To this end the emitter of the transistor 6 is coupled via the resistor 16, which serves to match the low output impedance of the amplifier to the 50Ω characteristic impedance of the coupler 7, and the d.c. blocking capacitor 22 to the port C of the coupler 7.

In accordance with the invention, the port D of the coupler 7 is terminated with a complex impedance which in this embodiment comprises the parallel resistor 8 and capacitor 20, each of which is variable to provide an adjustable mis-match for the coupler.

As already described, the collector current of the transistor 5 is selected to provide a suitable compromise between the conflicting requirements of a low noise figure and a wide dynamic range, without consideration for the input return loss of the amplifier. A result of this selection is that, if the port D of the coupler 7 were terminated with the characteristic impedance of the coupler, the amplifier would provide a poor match to the coupler 3 and hence would have a poor input return loss. However, the adjustable mis-match provided by the components 8 and 20 at the port D enables a controlled part of the amplifier output signal to be reflected back into the coupler 7 at the port D. This reflected signal is controlled by adjustment of the components 8 and 20 to influence the input signal path between the ports A and B of the coupler so that the return loss of the amplifier is increased, an increase from 6 dB to 20 dB input return loss being readily achievable. This adjustment is, of course, completely independent of the determination of the collector current of the transistor 5, and hence does not detract from the selected noise figure and dynamic range. Furthermore, the reflected signal from the port D, which appears at the port C with very little further attenuation, has a negligible effect on the output of the amplifier due to the low output impedance provided by the transistor 6.

As should be appreciated from the above description, the increased input return loss is achieved using a signal derived from the output of the preamplifier, and which is thus slightly delayed in relation to the input signal to the preamplifier. Even using the high frequency transistors mentioned above for the transistors 5 and 6, this signal delay through the preamplifier is sufficient that, at the designed I.F. of 70 MHz, the phase of the output signal is rotated from that of the input signal by an angle approaching 90 degrees. As a result of this phase rotation, optimizing the input return loss without degrading the noise figure of the preamplifier is facilitated in that the resistor 8 serves predominantly to control the imaginary part, and the capacitor 20 serves predominantly to control the real part, of the input impedance of the preamplifier at its input terminal 1.

From the above description of the nature of and connections to the coupler 7 it can be seen that the relatively low-level input signal at the input terminal 1 is coupled from the port A to the port B with very little attenuation; it is also coupled to the port D, at a very low level, where it has negligible effect. The relatively high-level amplifier output signal applied to the port C is coupled with little attenuation to the port D to produce the controlled reflected signal as already described, is coupled at a lower level to the port B as a negative feedback signal, and is isolated from the port A. The reflected signal at the port D is coupled to the port C where it has negligible effect as described above, is coupled at a reduced level to the port A to provide the desired improved input return loss, and is isolated from the port B.

As described above the complex impedance connected to the port D is constituted by a simple network comprising a parallel resistor and capacitor. However, it should be appreciated that any other suitable network may be provided to the same ends. In particular, it is observed that a higher order network of resistors and capacitors may be provided in place of the resistor 8 and capacitor 20 in order to provide a greater and more uniform input return loss across the full bandwidth of the I.F. amplifier. Furthermore, other forms of complex impedance network may be provided to suit particular requirements.

Whilst a particular embodiment of the invention has been described above, it should be appreciated that numerous changes may be made therein. For example, in the described amplifier inductive degeneration is provided by the inductor 33; alternatively, the gain-bandwidth can be controlled by a shunt capacitor connected to the collector of the transistor 5. However, the inductive degeneration described is preferred because this gives the amplifier a much better intermodulation characteristic.

Furthermore, the common-collector transistor 6 in the described amplifier could be replaced by a common-emitter transistor, the output of the amplifier and the feedback being taken from the collector of such a transistor, with the phase of the directional coupler being inverted to maintain negative feedback. However the common-collector arrangement described is preferred because it provides better isolation, at the output, of the signal reflected at the port D and has better propagation delay and linearity characteristics. Other forms of amplifier may be used without departing from the scope of the invention.

In addition, the invention is not limited to the particular form of the directional coupler described, and numerous other forms of directional coupler will occur to those skilled in the art and may be used without departing from the scope of the invention. In particular, it is observed that although the described form of the directional coupler uses two identical transformers, two transformers which are not identical could instead be used. For example the transformer 72 could have its high impedance winding tapped, with the low impedance winding of the transformer 71 connected to the tapping point instead of to the port C, for matching to a higher impedance coupled to the emitter of the transistor 6 and reducing the loading on this transistor.

Accordingly numerous modifications, variations, and adaptations may be made to the particular embodiment of the invention described without departing from the scope of the invention, which is defined in the claims.

What is claimed is:

1. An amplifier comprising an amplifier circuit and a negative feedback path for said amplifier circuit, the negative feedback path including a directional coupler having a first port coupled to an input of the amplifier, a second port coupled to an input of the amplifier circuit, a third port coupled to an output of the amplifier circuit, and a fourth port, and complex impedance means coupled to said fourth port for controlling input return loss of the amplifier.

2. An amplifier as claimed in claim 1 wherein the amplifier circuit comprises a common-collector transistor amplifier stage whose output constitutes the output of the amplifier circuit.

3. An amplifier as claimed in claim 1 or 2 wherein the amplifier circuit comprises a common-emitter transistor amplifier stage whose input constitutes the input of the amplifier circuit, the common-emitter transistor amplifier stage including an inductor connected in series with the emitter of the common-emitter transistor.

4. An amplifier as claimed in claim 1 or 2 wherein the impedance of the complex impedance means is adjustable.

5. An amplifier as claimed in claim 1 or 2 wherein the complex impedance means comprises a resistor connected in parallel with a capacitor.

6. An amplifier as claimed in claim 1 or 2 wherein the complex impedance means comprises a variable resistor connected in parallel with a variable capacitor.

7. An amplifier as claimed in claim 1 or 2 wherein the directional coupler comprises transformer coupling means.

8. An amplifier as claimed in claim 1 or 2 wherein the directional coupler comprises transformer coupling means, the amplifier including capacitive means coupled to said first port for compensating for leakage inductance of the transformer coupling means.

9. An amplifier comprising an amplifier circuit and a negative feedback path for said amplifier circuit, the negative feedback path including a directional coupler having first, second, third, and fourth ports of which the first and second ports are coupled together and the third and fourth ports are coupled together with little loss, the first and fourth ports are coupled together and the second and third ports are coupled together with a predetermined coupling factor, and the first and third ports and the second and fourth ports are substantially isolated from one another, wherein the first port is coupled to an input of the amplifier, the second port is coupled to an input of the amplifier circuit, and the third port is coupled to an output of the amplifier circuit, and complex impedance means coupled to the fourth port of the directional coupler for controlling input return loss of the amplifier.

10. An amplifier as claimed in claim 9 wherein the amplifier circuit comprises a common-collector transistor amplifier stage whose output constitutes the output of the amplifier circuit.

11. An amplifier as claimed in claim 10 wherein the output of the amplifier circuit is coupled to the third port of the directional coupler via an impedance matching resistor.

12. An amplifier as claimed in claim 11 wherein the amplifier circuit comprises a common-emitter transistor amplifier stage whose input constitutes the input of the amplifier circuit.

13. An amplifier as claimed in claim 12 wherein the common-emitter transistor amplifier stage includes an inductor connected in series with the emitter of the common-emitter transistor.

14. An amplifier as claimed in claim 13 wherein the directional coupler comprises transformer coupling means.

15. An amplifier as claimed in claim 13 wherein the directional coupler comprises a first transformer having a first winding coupled between the third and fourth ports and a second winding coupled between the second port and a point of reference potential, and a second transformer having a first winding coupled between the first and second ports and a second winding coupled between the third port and the point of reference potential.

16. An amplifier as claimed in claim 15 wherein the first and second transformers are substantially the same as one another.

17. An amplifier as claimed in claim 16 and including a capacitor coupled between the first port and the point of reference potential for compensating for the leakage inductance of the transformers.

18. An amplifier as claimed in claim 17 wherein the complex impedance means comprises a variable resistor connected in parallel with a variable capacitor.

* * * * *